(12) United States Patent
Yun et al.

(10) Patent No.: US 11,037,648 B2
(45) Date of Patent: Jun. 15, 2021

(54) MEMORY SYSTEM FOR IMPROVING MEMORY RELIABILITY AND MEMORY MANAGEMENT METHOD FOR THE SAME

(71) Applicant: SK hynix Inc., Icheon-si (KR)

(72) Inventors: Tae Sik Yun, Seoul (KR); Chun Seok Jeong, Seoul (KR)

(73) Assignee: SK hynix Inc., Icheon-si (KR)

( * ) Notice: Subject to any disclaimer, the term of this patent is extended or adjusted under 35 U.S.C. 154(b) by 227 days.

(21) Appl. No.: 16/051,796

(22) Filed: Aug. 1, 2018

(65) Prior Publication Data

US 2019/0172547 A1    Jun. 6, 2019

(30) Foreign Application Priority Data

Dec. 4, 2017  (KR) .................. 10-2017-0165333

(51) Int. Cl.
*G06F 11/27* (2006.01)
*G11C 29/44* (2006.01)
*G11C 29/42* (2006.01)
*G11C 29/36* (2006.01)
*G06F 11/263* (2006.01)

(52) U.S. Cl.
CPC ........ *G11C 29/4401* (2013.01); *G06F 11/263* (2013.01); *G06F 11/27* (2013.01); *G11C 29/36* (2013.01); *G11C 29/42* (2013.01)

(58) Field of Classification Search
CPC .... G06F 11/215; G06F 11/27; G06F 11/2215; G06F 11/263; G11C 29/4401; G11C 29/44; G11C 29/36; G11C 29/42
See application file for complete search history.

(56) References Cited

U.S. PATENT DOCUMENTS

| 6,237,116 B1* | 5/2001 | Fazel | .................. | G06F 11/1052 714/720 |
|---|---|---|---|---|
| 2001/0048625 A1* | 12/2001 | Patti | .................... | G11C 29/4401 365/201 |
| 2003/0191888 A1* | 10/2003 | Klein | .................. | G11C 11/4076 711/105 |
| 2004/0267481 A1* | 12/2004 | Resnick | ................. | G11C 29/26 702/117 |
| 2005/0281112 A1 | 12/2005 | Ito et al. | | |
| 2008/0209283 A1* | 8/2008 | Gupta | ................ | G11C 29/4401 714/718 |

(Continued)

FOREIGN PATENT DOCUMENTS

| KR | 100656717 B1 | 12/2006 |
|---|---|---|
| KR | 1020080048799 A | 6/2008 |

*Primary Examiner* — Yolanda L Wilson
(74) *Attorney, Agent, or Firm* — William Park & Associates Ltd.

(57) ABSTRACT

A memory system and a method for operating the same, wherein the memory system includes a first memory and a second memory each configured to store data. The memory system further includes a test and repair circuit operationally connected to the first memory and to the second memory. The test and repair circuit is configured to receive a test initiation signal and perform, in response to receiving the test initiation signal, a test operation on at least one of the first memory and the second memory. The test and repair circuit is also configured to perform, based on a result of the test operation, a repair operation on the at least one of the first memory and the second memory.

20 Claims, 4 Drawing Sheets

(56) References Cited

U.S. PATENT DOCUMENTS

| | | | |
|---|---|---|---|
| 2009/0193301 A1 | 7/2009 | Ito et al. | |
| 2010/0083037 A1* | 4/2010 | Oberlaender | G11C 29/52 714/5.1 |
| 2011/0289386 A1* | 11/2011 | Yang | G06F 11/106 714/764 |
| 2014/0146624 A1* | 5/2014 | Son | G11C 29/808 365/200 |
| 2014/0281693 A1* | 9/2014 | Jeddeloh | G06F 11/2017 714/6.32 |
| 2016/0284426 A1* | 9/2016 | Busi | G01R 31/3187 |
| 2020/0118641 A1* | 4/2020 | Yang | G06F 3/0614 |

\* cited by examiner

MEMORY SYSTEM FOR IMPROVING MEMORY RELIABILITY AND MEMORY MANAGEMENT METHOD FOR THE SAME

CROSS-REFERENCE TO RELATED APPLICATION

The present application claims priority under 35 U.S.C. § 119(a) to Korean patent application No. 10-2017-0165333, filed on Dec. 4, 2017, which is incorporated herein by reference in its entirety.

BACKGROUND OF THE INVENTION

Embodiments of the present disclosure relate to a memory system, and more particularly to a memory system for improving reliability of a memory element while simultaneously adjusting a data bandwidth, and a memory management method for the same.

A memory device is requisite for a system configured to perform a specific function. Therefore, the reliability of memory devices is of importance to facilitating the use of systems from the viewpoint of system administrators.

In various methods for improving the reliability of a memory device, the presence or absence of a defective or failed part in the memory device must be detected during system operation/management, and the detected defective or failed part must also be rapidly recovered.

Specifically, when using a System In Package (SIP) structure implemented by packaging memory devices and at least one logic circuit (e.g., a memory controller) into a single chip, without independently packaging only the memory devices into one chip, if a defective or failed part occurs in the memory devices of the SIP, the entire SIP chip must be replaced with another chip, such that reliability improvement of such memory devices is of higher importance to system use.

BRIEF SUMMARY OF THE INVENTION

In accordance with an embodiment of the present disclosure is a memory system that includes a first memory and a second memory each configured to store data. The memory system further includes a test and repair circuit operationally connected to the first memory and to the second memory. The test and repair circuit is configured to receive a test initiation signal and perform, in response to receiving the test initiation signal, a test operation on at least one of the first memory and the second memory. The test and repair circuit is also configured to perform, based on a result of the test operation, a repair operation on the at least one of the first memory and the second memory.

Also in accordance with an embodiment of the present disclosure is a memory management method performed by a memory system. The method includes writing or reading data in or from a first memory and a second memory; determining whether a preset test condition is satisfied during writing or reading of the data; and performing a test and a repair operations on at least one of the first memory and the second memory when the preset test condition is satisfied.

BRIEF DESCRIPTION OF THE DRAWINGS

The accompanying figures, together with the detailed description below, are incorporated in and form part of the specification. The figures serve to further illustrate embodiments of concepts that include claimed novelty and explain various principles and advantages of those embodiments.

DETAILED DESCRIPTION

Reference will now be made in detail to certain embodiments, examples of which are illustrated in the accompanying drawings. Terms or words used in the disclosure and the claims, absent an included definition, should be interpreted as having meanings and concepts coinciding with the technical scope and sprit of the present disclosure based on the understanding of someone having ordinary skill in the art. The embodiments described in the specification and shown in the drawings are purely illustrative and are not intended to represent all aspects of the invention. Accordingly, various modifications may be made to presented embodiments without departing from the spirit of the present teachings as described and claimed.

Various embodiments of the present disclosure are directed to providing a memory system for improving memory reliability and a memory management method for the memory system that resolve one or more problems due to limitations and disadvantages in the current state of the art. These teachings are also applicable to improving the performance of electronic devices which include memory systems in accordance with described embodiments.

In accordance with the present teachings is a memory system that includes a first memory and a second memory each configured to store data. The memory system further includes a test and repair circuit operationally connected to the first memory and to the second memory. The test and repair circuit is configured to receive a test initiation signal and perform, in response to receiving the test initiation signal, a test operation on at least one of the first memory and the second memory. The test and repair circuit is also configured to perform, based on a result of the test operation, a repair operation on the at least one of the first memory and the second memory.

In an embodiment, the memory system further includes a memory controller operationally connected to the test and repair circuit. The memory controller is configured to generate, based on a test condition being satisfied, the test initiation signal and send the test initiation signal to the test and repair circuit.

In another embodiment, the test and repair circuit is further configured to contemporaneously write data to the first memory and to the second memory. The test and repair circuit is also configured to contemporaneously read data from the first memory and the second memory. For a further embodiment, the test and repair circuit is also configured to receive write data and write a first portion of the write data to the first memory. Contemporaneously with writing the first portion of the write data to the first memory, the test and repair circuit is configured to write a second portion of the write data to the second memory.

For an embodiment, the test and repair circuit is further configured to contemporaneously write data to the first memory and read data from the second memory.

With an embodiment, the memory controller is further configured to generate a first test initiation signal when a number of error check and correction (ECC) occurrences for the first memory reaches a first threshold value. The first test initiation signal, upon being received by the test and repair circuit, initiates the test operation on the first memory. In a further embodiment, the memory controller is also configured to generate a second test initiation signal when a number of error check and correction (ECC) occurrences for the second memory reaches a second threshold value. The second test initiation signal, upon being received by the test and repair circuit, initiates the test operation on the second memory.

For an embodiment, the memory controller is configured to send the test initiation signal to the test and repair circuit at predetermined intervals of time. In another embodiment, the memory controller is configured to generate a first test initiation signal upon expiration of a first time interval, wherein the first test initiation signal, upon being received by the test and repair circuit, initiates the test operation on the first memory. The memory controller is also configured to generate a second test initiation signal upon on expiration of a second time interval, wherein the second time interval is initiated based on the expiration of the first time interval, and wherein the second test initiation signal, upon being received by the test and repair circuit, initiates the test operation on the second memory.

In a different embodiment, the memory controller is configured to generate the test initiation signal when a measured change in temperature for the memory system is greater than a temperature change threshold value. For another embodiment, the memory controller is configured to generate the test initiation signal based on the test condition being satisfied and based on receiving a power-OFF or a power-ON signal.

With an embodiment, the memory controller is configured to generate a first test initiation signal when a measured change in temperature for the memory system is greater than a temperature change threshold value, wherein the first test initiation signal, upon being received by the test and repair circuit, initiates the test operation on the first memory. The memory controller is also configured to receive an indication from the test and repair circuit indicating completion of the test operation on the first memory. The memory controller is further configured to generate a second test initiation signal after receiving the indication, wherein the second test initiation signal, upon being received by the test and repair circuit, initiates the test operation on the second memory.

Also in accordance with the present teachings is a memory management method performed by a memory system. The method includes writing to and reading from a first memory of the memory management system in addition to writing to and reading from a second memory of the memory management system. The method further includes receiving, by a test and repair circuit of the memory system, a test initiation signal performing, by the test and repair circuit, in response to receiving the test initiation signal, a test operation on at least one of the first memory and the second memory. The method also includes performing, by the test and repair circuit, based on a result of the test operation, a repair operation on the at least one of the first memory and the second memory.

In one embodiment, the method further includes generating, by a memory controller of the memory system, based on a test condition being satisfied, the test initiation signal and sending, by the memory controller, the test initiation signal to the test and repair circuit. In another embodiment, the method further includes receiving, by the memory controller, an indication of the test condition being satisfied, wherein the test condition being satisfied includes a number of error check and correction (ECC) occurrences for at least one of the first memory or the second memory reaching a first threshold value.

For a different embodiment, the method includes receiving, by the memory controller, an indication of the test condition being satisfied, wherein the test condition being satisfied includes an expiration of a predetermined interval of time. In an alternate embodiment, the method includes receiving, by the memory controller, an indication of the test condition being satisfied, wherein the test condition being satisfied includes a measured change in temperature for the memory system being greater than a predetermined temperature change threshold value. With another embodiment, the method includes receiving, by the memory controller, an indication of the test condition being satisfied, wherein the test condition being satisfied includes receiving a power-OFF or a power-ON signal.

For some embodiments, the memory controller generating the test initiation signal includes the memory controller generating at least one of a first test initiation signal and a second test initiation signal. Further, the test and repair circuit performing the repair operation includes the test and repair circuit performing the repair operation on the first memory when the test initiation signal includes the first test initiation signal and performing the repair operation on the second memory when the test initiation signal includes the second test initiation signal.

In one embodiment, the method includes suspending, by the memory controller, writing data to the first memory during a time period for which the test and repair circuit is performing the test operation on the first memory and writing, by the memory controller, data to the first memory during the time period. The method further includes generating, by the test and repair circuit, test data and writing, by the test and repair circuit, the test data to the first memory during the time period.

In accordance with some embodiments, the first memory is a normal memory and the second memory is a redundant memory. For instance, some or all of the data written to the normal memory is also written to the redundant memory. In some situations, data is written to the redundant memory when the normal memory is not functioning optimally, is not functioning within a given set of parameters, is not functioning at all, or when the normal memory is being tested and/or repaired. In other embodiments, the first memory is a main memory and the second memory is an ancillary memory.

The word "contemporaneously," as used herein, indicates two or more events and or operations occurring simultaneously or occurring during overlapping intervals of time.

In accordance with some embodiments, a test operation may be a built-in self test (BIST) operation. In accordance with additional embodiments, a repair operation may be a built-in self repair (BISR) operation. For a number of embodiments, a test and repair circuit is represented by a BIST/BISR circuit.

A memory controller generating a test initiation signal, as used herein, includes embodiments for which the test initiation signal is generated by a hardware component connected to or collocated with the memory controller when the hardware component performs functionality related to or associated with a memory controller. For example, an embodiment might include multiple memory controllers with test initiation signals being generated by one of or different combinations of the memory controllers.

Figure 1:
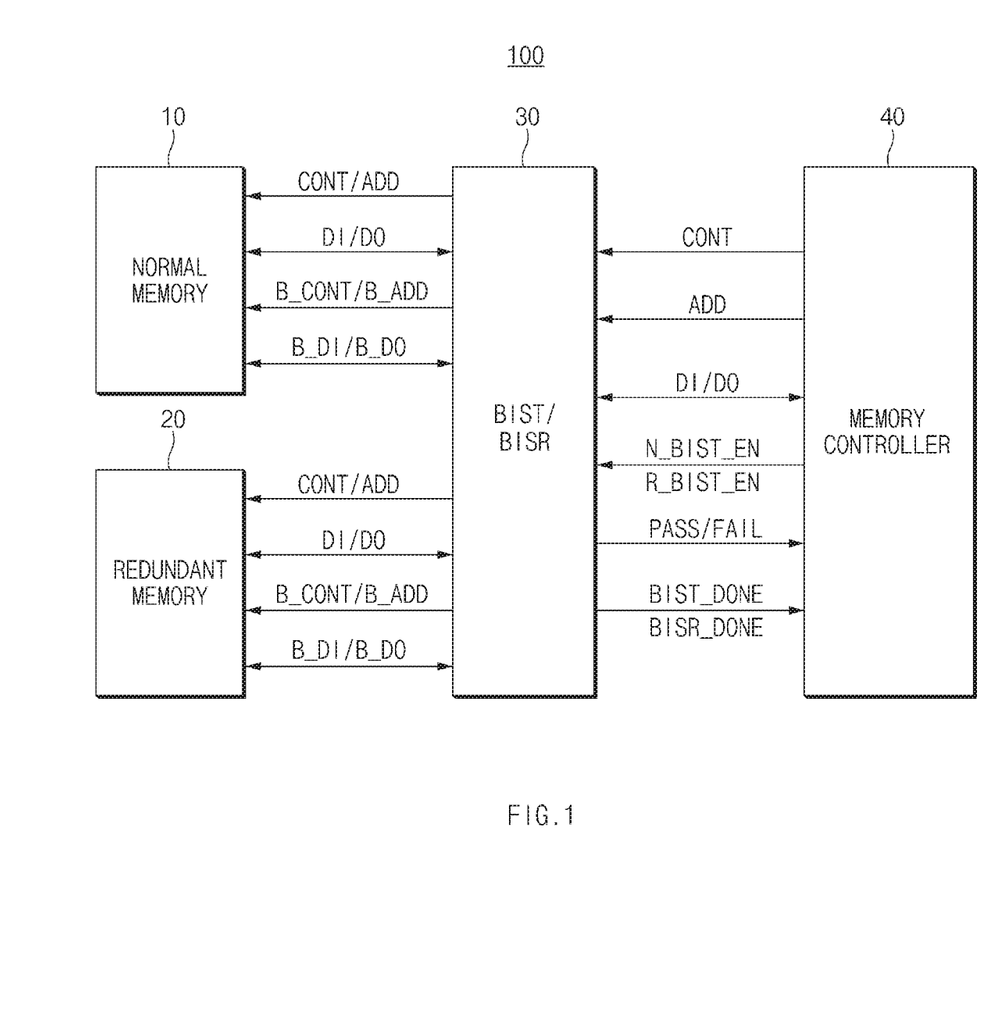
FIG. 1 shows a block diagram illustrating a memory system according to an embodiment of the present disclosure.

FIG. 1 shows a block diagram illustrating a memory system 100.

Referring to FIG. 1, the memory system 100 may include a normal memory 10, a redundant memory 20, a Built-in Self Test/Built-in Self Repair (BIST/BISR) circuit 30, and a memory controller 40.

The normal memory 10 is a main memory of the memory system 100 and may store data needed to operate the memory system 100. In response to a control signal (CONT or B_CONT) and an address signal (ADD or B_ADD), the normal memory 10 may store data (DI or B_DI) received from the BIST/BISR circuit 30 in memory cells or may read data (DO or B_DO) stored in memory cells and output the read data (DO or B_DO) to the BIST/BISR circuit 30. For example, during a normal mode, the normal memory 10 may store or output data (DI/DO) in response to the control signal (CONT) and the address signal (ADD). During a test mode (i.e., a Built-in Self Test (BIST) operation), the normal memory 10 may store or output test data (B_DI/B_DO) in response to the control signal (B_CONT) and the address signal (B_ADD). The normal memory 10 may include volatile memory (e.g., DRAM, SRAM, etc.) and/or non-volatile memory (e.g., FeRAM, PRAM, ReRAM, MRAM, etc.). Although only one normal memory 10 is illustrated in FIG. 1 for convenience of description, a plurality of normal memories may also be used.

When a defective or failed part occurs in the normal memory 10 or the BIST or BISR operation for the normal memory 10 performs, the redundant memory 20 may substitute for the normal memory 10. In the same manner as for the normal memory 10, upon receiving the control signal (CONT or B_CONT) and the address signal (ADD or B_ADD), the redundant memory 20 may store data (DI or B_DI) received from the BIST/BISR circuit 30 in memory cells, or the redundant memory 20 may read data (DO or B_DO) stored in memory cells and output the read data (DO or B_DO) to the BIST/BISR circuit 30. The redundant memory 20 may have the same structure and function as the normal memory 10. Although only one redundant memory 20 is illustrated in FIG. 1 for convenience of description, a plurality of redundant memories may also be used.

The BIST/BISR circuit 30 may be disposed between the memory controller 40 and the memories 10 and 20, such that the BIST/BISR circuit 30 may perform communication of data I/O signals (CONT and ADD) and data (DI and DO) between the memory controller 40 and the memories 10 and 20 or may perform the BIST or BISR operation for the normal memory 10 and the redundant memory 20. For example, when the memory system 100 operates in the normal mode, the BIST/BISR circuit 30 may transmit signals (CONT and ADD) for an input/output (I/O) operation of data received from the memory controller 40 to the memories 10 and 20, and at the same time, may transmit the input data (DI) to the memories 10 and 20, such that data may be written or the output data (DO) read from the memories 10 and 20 may be transmitted to the memory controller 40. That is, when the memory system 100 operates in the normal mode, the BIST/BISR circuit 30 may bypass the signals (CONT and ADD) and the data (DI) received from the memory controller 40 to the memories 10 and 20, and may bypass the data (DO) received from the memories 10 and 20 to the memory controller 40. In this case, the BIST/BISR circuit 30 may use the memories 10 and 20 using the same or different methods. For example, during the data write operation or the data read operation, the BIST/BISR circuit 30 may simultaneously write the same data in the normal memory 10 and the redundant memory 20 or may simultaneously read the same data from the normal memory 10 and the redundant memory 20. Alternatively, during the data write operation, the BIST/BISR circuit 30 may simultaneously write the same data in the normal memory 10 and the redundant memory 20. During the data read operation, the BIST/BISR circuit 30 may read data from any one of the normal memory 10 and the redundant memory 20. In addition, when a bandwidth of data to be written is larger than a bandwidth of the normal memory 10, the BIST/BISR circuit 30 may perform a multi-channel function in which the corresponding data is divisionally written in the normal memory 10 and the redundant memory 20.

Upon receiving test initiation signals (N_BIST_EN/R_BIS_EN) from the memory controller 40, the BIST/BISR circuit 30 may stop input/output (I/O) operation of the data (DI/DO) for the normal memory 10 or the redundant memory 20; may generate the control signal (B_CONT), the address signal B_ADD, and the data (B_DI) needed for testing; may transmit the generated control signal (B_CONT), the address signal (B_ADD), and the data (B_DI) to the corresponding memory 10 or 20; and may thus perform the BIST operation. Upon completion of the BIST operation, the BIST/BISR circuit 30 may transmit a notification signal (BIST_DONE), for indicating test completion, and a result notification signal (PASS/FAIL), for indicating test passage or failure, to the memory controller 40. The BIST/BISR circuit 30 may also perform the BISR operation for the defective or failed memory (10 and/or 20). In this case, during the BIST or BISR operation for any one memory 10 or 20, the BIST/BISR circuit 30 may write or read data in or from the other memory 20 or 10. In other words, the normal memory 10 and the redundant memory 20 might not be simultaneously tested or repaired, and may be alternately tested or repaired. For some embodiments, the above-mentioned BIST and/or BISR operations for the memories 10 and/or 20 may represent any conventional self test and/or self repair operations. Upon completion of the BISR operation, the BIST/BISR circuit 30 may transmit a notification signal (BISR_DONE) for indicating repair completion to the memory controller 40.

The memory controller 40 may perform the data I/O operation and the BIST/BISR operation for the memories 10 and 20. When the memory system 100 operates in the normal mode, the memory controller 40 may generate signals (CONT and ADD) needed for data input/output according to an instruction message of a host (not shown), may transmit the generated signals (CONT and ADD) to the BIST/BISR circuit 30, and may transmit and receive data (DI) to be input and the other data (DO) to be output to/from the BIST/BISR circuit 30. When the preset conditions are satisfied, the memory controller 40 may generate a test initiation signal (N_BIST_EN) for the normal memory 10 and a test initiation signal (R_BIST_EN) for the redundant memory 20, and may output the two initiation signals (N_BIST_EN and R_BIST_EN) to the BIST/BISR circuit 30. For example, whenever the number of ECC (Error Check and Correction) occurrences for the normal memory 10 or the redundant memory 20 is higher than a reference number of times, or whenever a change in system temperature is higher than a reference value, the memory controller 40 may generate the test initiation signal (N_BIST_EN or R_BIST_EN). Alternatively, the memory controller 40 may also generate the test initiation signal (N_BIST_EN or R_BIST_EN) at predetermined intervals of time. When the BIST or BISR operation for any one memory 10 or 20 is completed, the memory controller 40 may copy data stored in one normally-operated memory in the other BIST- or BISR-processed memory, such that data stored in the memories 10 and 20 may be identical to each other. This copying action may also be called a dead copy.

Figure 2:
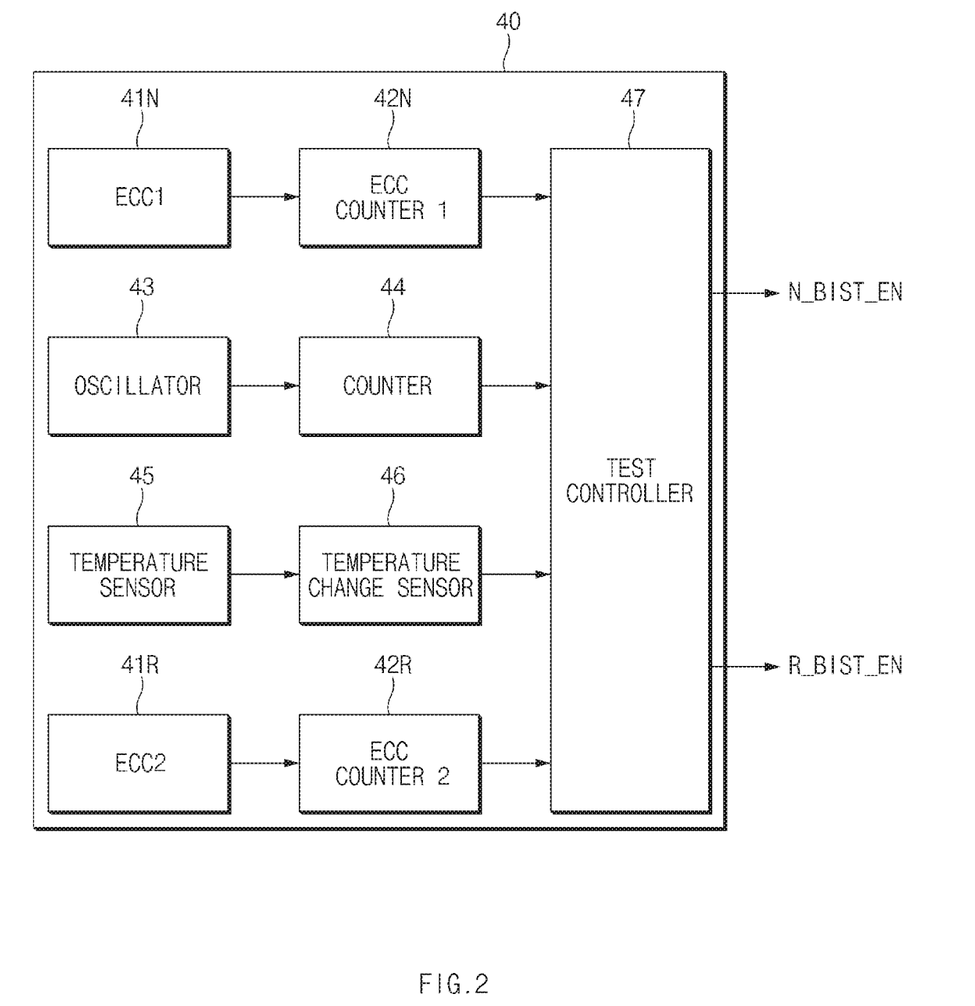
FIG. 2 shows a block diagram illustrating the memory controller of FIG. 1 according to an embodiment of the present disclosure.

FIG. 2 shows a block diagram illustrating a memory controller, indicated to be the memory controller 40 of FIG. 1, in greater detail. More particularly, FIG. 2 illustrates constituent elements for controlling testing of the normal memory 10 and the redundant memory 20.

Referring to FIG. 2, the memory controller 40 may include a first ECC (Error Check and Correction) circuit 41N, a second ECC circuit 41R, a first ECC counter 42N, a second ECC counter 42R, an oscillator 43, a counter 44, a temperature sensor 45, a temperature change sensor 46, and a test controller 47. The ECC circuit 41N and the ECC circuit 41R are also referred to as the ECC 41N and the ECC 41R, respectively.

The first ECC 41N may perform Error Check and Correction (ECC) of data to be written in or read from the normal memory 10 using a parity bit, and the first ECC 41N may output a signal for indicating ECC completion (i.e., a first ECC signal) to the first ECC counter 42N.

The second ECC 41R may perform ECC of data to be written in or read from the redundant memory 20 using a parity bit, and the second ECC 41R may output a signal for indicating ECC completion (i.e., a second ECC signal) to the second ECC counter 42R.

The first ECC counter 42N may count the number of first ECC signals received from the first ECC 41N. When the counted number of the first ECC signals reaches a predetermined reference value, such as a first threshold value, the first ECC counter 42N may output a signal (i.e., a first ECC-over signal) for indicating that the counted number of the first ECC signals has reached the predetermined reference value to the test controller 47. After the first ECC counter 42N outputs the first ECC-over signal, the first ECC counter 42N may initialize previous count information, and may re-count the number of occurrences of the first ECC signals.

The second ECC counter 42R may count the number of second ECC signals received from the second ECC 41R. When the counted number of the second ECC signals reaches a predetermined reference value, such as a second threshold value, the second ECC counter 42R may output a signal (i.e., a second ECC-over signal) for indicating that the counted number of the second ECC signals has reached the predetermined reference value to the test controller 47. After the second ECC counter 42R outputs the second ECC-over signal, the second ECC counter 42R may initialize previous count information, and may re-count the number of occurrences of the second ECC signals. For some embodiments, the first threshold value may be the same as the second threshold value. In other embodiments, the first and second threshold values have different values.

The oscillator 43 may generate and output an oscillation signal (e.g., a pulse signal) at intervals of a predetermined time.

The counter 44 may count the number of oscillation signals generated from the oscillator 43. When the counted number of the oscillation signals reaches a predetermined reference value, the counter 44 may output a time signal for indicating that the counted number of the oscillation signals has reached the predetermined reference value, the counter 44 to the test controller 47. In other words, the counter 44 may use an output signal of the oscillator 43 to periodically output the time signal.

The temperature sensor 45 may detect a temperature of the memory system 100, and may output a temperature signal indicating the detected temperature to the temperature change sensor 46.

The temperature change sensor 46 may use the temperature signal received from the temperature sensor 45 to determine whether a temperature change of the memory system 100 is greater than a predetermined reference value, such as a temperature change threshold value. When the temperature change is greater than the predetermined reference value, the temperature change sensor 46 may output to the test controller 47 a signal (i.e., a temperature-over signal) indicating the fact that the temperature change of the memory system 100 is greater than the predetermined reference value.

The test controller 47 may selectively generate and output a test initiation signal (N_BIST_EN or R_BIST_EN) for the normal memory 10 or the redundant memory 20, respectively, in response to the first ECC-over signal, the second ECC-over signal, the time signal, and the temperature-over signal.

For example, upon receiving the first ECC-over signal, the test controller 47 may output the test initiation signal (N_BIST_EN) for the normal memory 10. Upon receiving the second ECC-over signal, the test controller 47 may output the test initiation signal (R_BIST_EN) for the redundant memory 20.

Upon receiving the temperature-over signal, the test controller 47 may successively test the normal memory 10 and the redundant memory 20. For example, the test controller 47 may first output the test initiation signal (N_BIST_EN) and may thus test the normal memory 10. Upon completion of the test for the normal memory 10, the test controller 47 may output the test initiation signal (R_BIST_EN) and may thus test the redundant memory 20.

Upon receiving the time signal, the test controller 47 may selectively output the test initiation signals to alternately test the normal memory 10 and the redundant memory 20 in the order of occurrences of the time signals. For example, upon receiving a first time signal, the test controller 47 may output the test initiation signal (N_BIST_EN) for testing the normal memory 10. Upon receiving a second time signal, the test controller 47 may output the test initiation signal (R_BIST_EN) for testing the redundant memory 20.

When the test controller 47 successively receives the ECC-over signal, the time signal, and the temperature-over signal, if testing of the received signals is not yet completed (i.e., if the PASS or FAIL signal is not yet received), or if testing of the first reception signal is completed (i.e., reception of the BIST_DONE signal) and a predetermined reference time has not yet elapsed from the testing completion, the test controller 47 may discard the remaining reception signals other than the first reception signal.

In some instances, even though the above-mentioned test conditions are satisfied, the test controller 47 may not immediately generate the test initiation signal. For example, the test controller 47 may generate the test initiation signal such that the BIST or BISR operation is carried out when the test controller 47 receives a power-OFF signal or a power-ON (rebooting) signal of the memory system 100. The test controller 47 might be unable to perform the BIST operation during operation of the memory system 100, for instance, when the memory system 100 operates using only one of the normal memory 10 and the redundant memory 20. In this case, the test controller 47 may not immediately perform the BIST operation even though the test condition is satisfied. The test controller 47 may enter a standby mode until receiving the power-OFF signal or the power-ON (rebooting) signal and then perform the BIST operation after reception of the power-OFF signal or the power-ON (rebooting) signal.

Although presented embodiments disclose that the test operation is performed using the ECC-over signal, the time signal, and the temperature-over signal, the scope or spirit of the present disclosure is not limited thereto, and different sets of conditions needed for the test operation may be selected at the discretion of a system designer. For example, any one of the ECC, time, and temperature conditions may be used, or only two conditions selected from among the ECC, time and temperature conditions may be optionally used. In other embodiments, additional or different conditions may determine when a test is performed.

Figure 3:
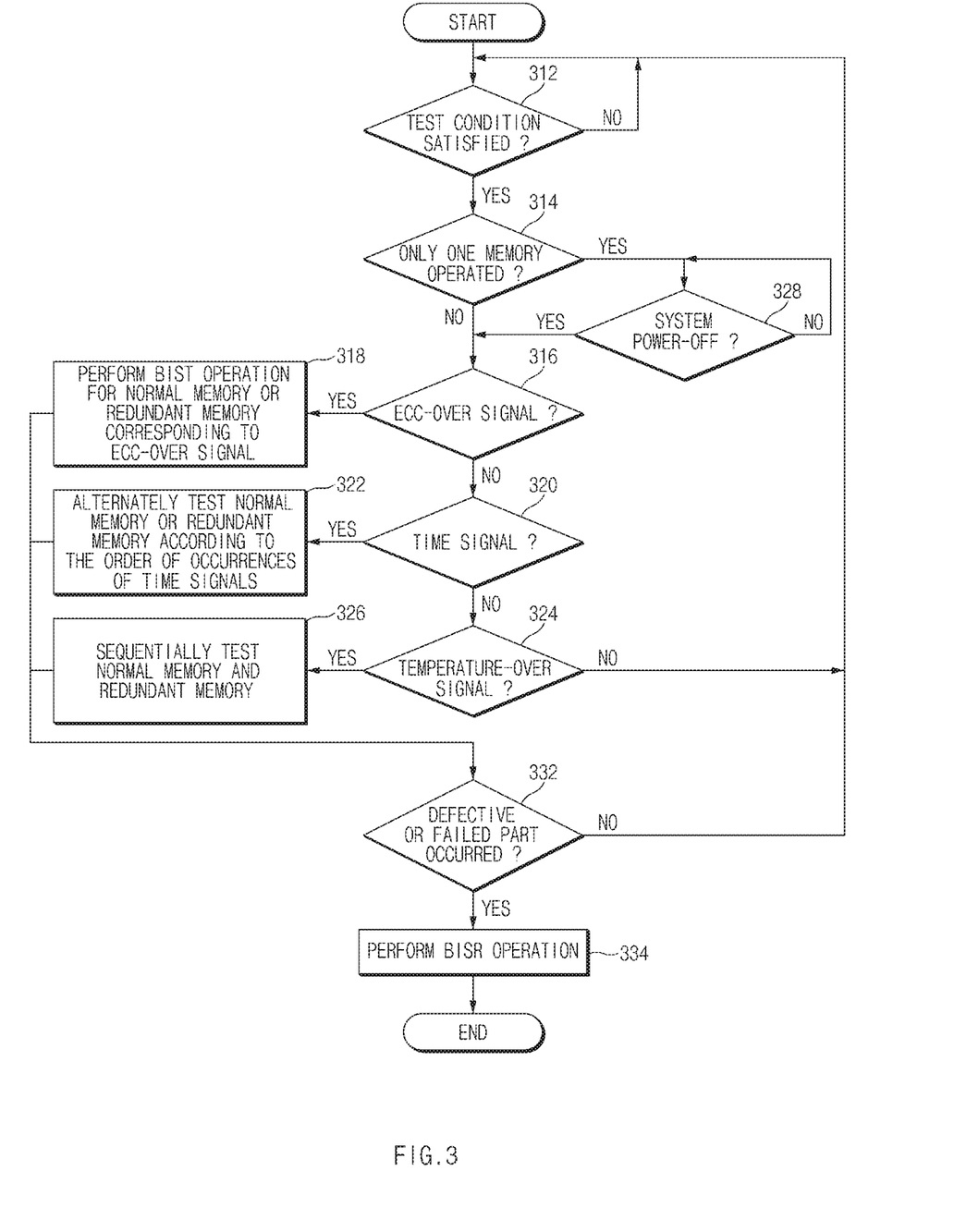
FIG. 3 shows a flowchart illustrating a memory management method according to an embodiment of the present disclosure.

FIG. 3 shows a flowchart illustrating a memory management method. In more detail, FIG. 3 illustrates a method for performing the BIST operation.

During the data write operation or the data read operation for the normal memory 10 and the redundant memory 20, the memory controller 40 may successively determine 312 whether or not a predetermined test condition is satisfied.

When the test condition is satisfied, the memory controller 40 may determine 314 whether both or only one of the normal memory 10 and the redundant memory 20 are normally used.

For example, the memory controller 40 may determine whether only one of the normal memory 10 and the redundant memory 20 is currently being used due to a defective or failed part in either the normal memory 10 or the redundant memory 20.

When both the normal memory 10 and the redundant memory 20 are normally used, the memory controller 40 may perform the BIST operation based on a test condition.

When the test condition corresponds to an occurrence of the ECC-over signal, indicated at 316, the memory controller 40 may perform 318 the BIST operation for the memory 10 or 20 based on the corresponding ECC-over signal as indicated at 318.

For example, when the first ECC counter 42N outputs the first ECC-over signal, the test controller 47 may output the test initiation signal (N_BIST_EN) for the normal memory 10. When the second ECC counter 42R outputs the second ECC-over signal, the test controller 47 may output the test initiation signal (R_BIST_EN) for the redundant memory 20. Accordingly, the BIST/BISR circuit 30 may perform the BIST operation for the normal memory 10 or the redundant memory 20 according to a preset algorithm and may output a response signal (PASS or FAIL) to the memory controller 40.

When the test condition corresponds to an occurrence of the time signal, indicated at 320, the memory controller 40 may alternately test 322 the normal memory 10 and the redundant memory 20 according to an order of occurrence for the time signals indicated at 322.

For example, when the time signal generated by the counter 44 is a first signal (e.g., an odd signal), the test controller 47 may output the test initiation signal (N_BIST_EN) for the normal memory 10. When the time signal generated by the counter 44 is a second signal (e.g., an even signal), the test controller 47 may output the test initiation signal (R_BIST_EN) for the redundant memory 20.

When the test condition corresponds to an occurrence of the temperature-over signal, indicated at 324, the memory controller 40 may sequentially test 326 the normal memory 10 and the redundant memory 20.

For example, when the temperature change sensor 46 outputs the temperature-over signal, the test controller 47 may first output the test initiation signal (N_BIST_EN) to perform the BIST operation for the normal memory 10. Upon completion of the BIST operation of the normal memory 10, the test controller 47 may output the test initiation signal (R_BIST_EN) and may thus perform the BIST operation for the redundant memory 10.

When only one memory (e.g., only the normal memory 10) is currently being used, indicated at 314, the memory controller 40 may stay in the standby mode until the power-OFF signal for the memory system 100 is received, indicated at 328.

For some embodiments, the BIST operation does not occur during a normal data write/read operation. For a target memory to be stopped and must write or read data needed for a test, such that it is impossible to test the normal memory 10 when the memory system 100 normally performs unique functions using only the normal memory 10. Therefore, although the test condition is satisfied, the memory controller 40 may not perform testing until reaching a predetermined time at which the memory system 100 no longer performs unique functions. One such predetermined time occurs when the power-OFF signal is input.

Upon receiving the power-OFF signal, the memory controller 40 may perform the BIST operation for the normal memory 10 as indicated at 318, 322, 326 through the determination as indicated at 316, 320, 324.

If the performed BIST operation 318, 322, 326 indicates 332 one or more defective and/or failed parts in the normal memory 10 and/or in the redundant memory 20, then the BIST/BISR circuit 30 may perform 334 the BISR operation.

Figure 4:
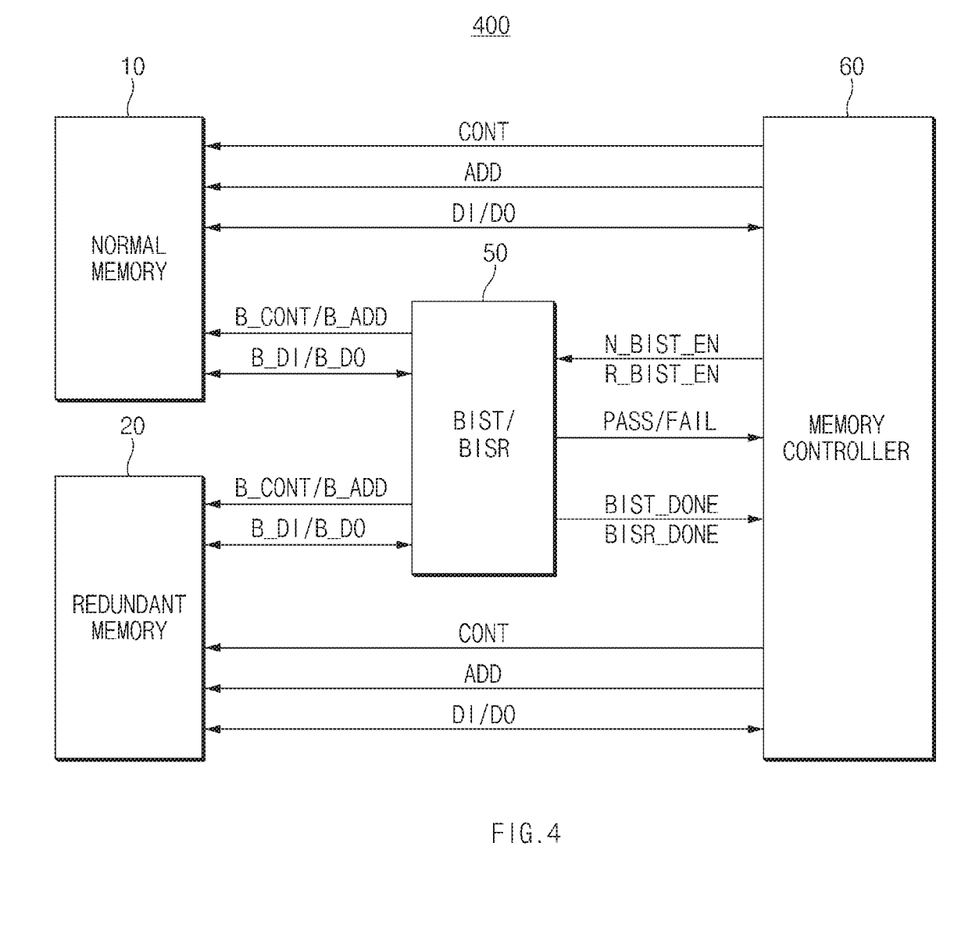
FIG. 4 shows a block diagram illustrating a memory system according to another embodiment of the present disclosure.

FIG. 4 shows a block diagram illustrating a memory system 400 according to another embodiment of the present disclosure.

For the memory system 100 of FIG. 1, general data write/read operations not related to testing and/or repairing memory involve the BIST/BISR circuit 30. During a normal write/read operation, the BIST/BISR circuit 30 may pass the signals (CONT and ADD) and data (DI) received from the memory controller 40, and may output the passed signals (CONT and ADD) and data (DI) to the normal memory 10 and the redundant memory 20. In addition, the BIST/BISR circuit 30 may also pass data (DO) read from the memories 10 and 20, and may output the data (DO) to the memory controller 40.

For the memory system 400 of FIG. 4, by contrast, general data write/read operations may be performed with a memory controller 60 communicating directly with the normal memory 10 and the redundant memory 20. The signals (CONT and ADD) and input data (DI) received by the normal memory and/or the redundant memory 20 from the memory controller 60, for example, do not pass through a BIST/BISR circuit 50. Similarly, output data (DO) received by the memory controller 60 from the normal memory and/or the redundant memory 20 does not pass through a BIST/BISR circuit 50. The BIST and BISR operations may be performed for the corresponding memory when a BIST/BISR circuit 50 receives the test initiation signals (N_BIST_EN and R_BIST_EN) from the memory controller 60.

A method for performing the BIST/BISR operations for the normal memory 10 and/or the redundant memory 20 for the system 400 may be performed in the same manner as described above for the memory system 100.

During writing or reading of common data, the memory controller 60 may simultaneously write the same data in the normal memory 10 and in the redundant memory 20, or may simultaneously read data from the normal memory 10 and from the redundant memory 20. Alternatively, during the data write interval, the memory controller 60 may simultaneously write the same data in the normal memory 10 and the redundant memory 20. During the data read interval, the memory controller 60 may read data from any one of the normal memory 10 and the redundant memory 20. In addition, when a bandwidth of data to be written is larger than a bandwidth of the normal memory 10, the memory controller 60 may perform a multi-channel function for which the data is divisionally written in the normal memory 10 and the redundant memory 20. When a test condition is satisfied, the memory controller 60 may selectively generate the test initiation signal (N_BIST_EN or R_BIST_EN) according to the satisfied condition and may output the generated test initiation signal to the BIST/BISR circuit 50.

As is apparent from the above description, the embodiments of the present disclosure can improve reliability of one or more memory devices for use in a system.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A memory system comprising:
a first memory configured to store data;
a second memory configured to store data; and
a test and repair circuit operationally connected to the first memory and to the second memory, wherein the test and repair circuit is configured to:
contemporaneously write non-test data to the first memory and to the second memory during a normal mode; and
during a test mode, perform a test operation on the first memory Ili writing test data thereto and write non-test data to, or read non-test data from, the second memory.

2. The memory system according to claim 1 further comprising a memory controller operationally connected to the test and repair circuit, wherein the memory controller is configured to:
generate, based on a test condition being satisfied, a test initiation signal; and
send the test initiation signal to the test and repair circuit.

3. The memory system according to claim 2, wherein the memory controller is further configured to generate a first test initiation signal when a number of error check and correction (ECC) occurrences for the first memory reaches a first threshold value, wherein the first test initiation signal, upon being received by the test and repair circuit, initiates the test operation on the first memory.

4. The memory system according to claim 3, wherein the memory controller is further configured to generate a second test initiation signal when a number of error check and correction (ECC) occurrences for the second memory reaches a second threshold value, wherein the second test initiation signal, upon being received by the test and repair circuit, initiates the test operation on the second memory.

5. The memory system according to claim 2, wherein the memory controller is further configured to send the test initiation signal to the test and repair circuit at predetermined intervals of time.

6. The memory system according to claim 2, wherein the memory controller is further configured to:
generate a first test initiation signal upon expiration of a first time interval, wherein the first test initiation signal, upon being received by the test and repair circuit, initiates the test operation on the first memory; and
generate a second test initiation signal upon on expiration of a second time interval, wherein the second time interval is initiated based on the expiration of the first time interval, and wherein the second test initiation signal, upon being received by the test and repair circuit, initiates the test operation on the second memory.

7. The memory system according to claim 2, wherein the memory controller is further configured to generate the test initiation signal when a measured change in temperature for the memory system is greater than a temperature change threshold value.

8. The memory system according to claim 2, wherein the memory controller is further configured to:
generate a first test initiation signal when a measured change in temperature for the memory system is greater than a temperature change threshold value, wherein the first test initiation signal, upon being received by the test and repair circuit, initiates the test operation on the first memory;
receive an indication from the test and repair circuit indicating completion of the test operation on the first memory; and
generate a second test initiation signal after receiving the indication, wherein the second test initiation signal, upon being received by the test and repair circuit, initiates the test operation on the second memory.

9. The memory system according to claim 2, wherein the memory controller is further configured to generate the test initiation signal based on the test condition being satisfied and based on receiving a power-OFF or a power-ON signal.

10. The memory system according to claim 1, wherein the test and repair circuit is further configured to:
contemporaneously read non-test data from the first memory and the second memory during the normal mode.

11. The memory system according to claim 1, wherein the test and repair circuit is further configured to:
receive write data;

write a first portion of the write data to the first memory; and
write, contemporaneously with writing the first portion of the write data to the first memory, a second portion of the write data to the second memory.

12. The memory system according to claim 1, wherein the test and repair circuit is further configured to read non-test data from one of the first memory and the second memory during the normal mode.

13. A memory system comprising:
a first memory configured to store data;
a second memory configured to store data;
a test and repair circuit operationally connected to the first memory and to the second memory; and
a memory controller operationally connected to the test and repair circuit, the first memory and the second memory,
wherein the test and repair circuit is configured to perform a test operation on the first memory and to write non-test data to or read non-test data from the second memory during a test mode, and
wherein the memory controller is configured to contemporaneously write non-test data to the first memory and to the second memory.

14. A memory management method by a memory system, the method comprising:
contemporaneously writing or reading non-test data in or from a first memory and a second memory;
determining whether a preset test condition is satisfied during writing or reading of the non-test data; and
performing a test and a repair operation on at least one of the first memory and the second memory when the preset test condition is satisfied,
wherein the test and the repair operation are alternately performed on the first memory and the second memory.

15. The memory management method according to claim 14, wherein the writing or reading the non-test data includes:
contemporaneously writing non-test data in the first memory and the second memory; and
contemporaneously reading non-test data from the first memory and the second memory.

16. The memory management method according to claim 14, wherein the writing or reading the non-test data includes:
contemporaneously writing non-test data in the first memory and the second memory; and
reading non-test data from any one of the first memory and the second memory.

17. The memory management method according to claim 14, wherein the determining whether the preset test condition is satisfied includes:
determining whether the number of error check and correction (ECC) occurrences for at least one of the first memory and the second memory reaches a first threshold value.

18. The memory management method according to claim 14, wherein the determining whether the preset test condition is satisfied includes:
determining whether a predetermined interval of time is expired.

19. The memory management method according to claim 14, wherein the determining whether the preset test condition is satisfied includes:
determining whether a measured change in temperature is greater than a predetermined temperature change threshold value.

20. The memory management method according to claim 14, wherein the test and the repair operations are performed after receiving a power-OFF or a power-ON signal.

* * * * *